United States Patent
Yoshida et al.

(10) Patent No.: US 9,070,812 B2
(45) Date of Patent: Jun. 30, 2015

(54) ACTIVE MATRIX SUBSTRATE, METHOD FOR FABRICATING THE SAME, AND DISPLAY DEVICE

(75) Inventors: Masahiro Yoshida, Osaka (JP); Takaharu Yamada, Osaka (JP); Satoshi Horiuchi, Osaka (JP); Kazuyori Mitsumoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 133 days.

(21) Appl. No.: 13/819,871
(22) PCT Filed: Aug. 29, 2011
(86) PCT No.: PCT/JP2011/004797
  § 371 (c)(1),
  (2), (4) Date: Feb. 28, 2013
(87) PCT Pub. No.: WO2010/029281
  PCT Pub. Date: Mar. 8, 2012

(65) Prior Publication Data
  US 2013/0153912 A1    Jun. 20, 2013

(30) Foreign Application Priority Data
  Sep. 3, 2010 (JP) .................................. 2010-197881

(51) Int. Cl.
  | | |
  |---|---|
  | H01L 23/544 | (2006.01) |
  | H01L 29/04 | (2006.01) |
  | H01L 29/10 | (2006.01) |
  | H01L 31/00 | (2006.01) |
  | H01L 33/08 | (2010.01) |
  | H01L 27/12 | (2006.01) |
  | H01L 29/786 | (2006.01) |
  | G02F 1/1339 | (2006.01) |
  | G02F 1/1333 | (2006.01) |

(52) U.S. Cl.
  CPC .............. H01L 33/08 (2013.01); *G02F 1/1339* (2013.01); *G02F 2001/133354* (2013.01); *G02F 2201/50* (2013.01); H01L 23/544 (2013.01); H01L 27/1214 (2013.01); *H01L 2223/5442* (2013.01);
  CPC ................... *H01L 2223/54426* (2013.01); *H01L2223/54486* (2013.01); H01L 29/786 (2013.01); H01L 27/1259 (2013.01); *H01L 2924/0002* (2013.01)
  USPC ...................... 257/797; 257/59; 257/E23.179

(58) Field of Classification Search
  USPC ............ 257/59, 797, E23.179; 438/401, 462
  See application file for complete search history.

(56) References Cited

U.S. PATENT DOCUMENTS

| | | | |
|---|---|---|---|
| 6,124,917 A | 9/2000 | Fujioka et al. | |
| 6,400,439 B1 | 6/2002 | Fujioka et al. | |
| 6,653,216 B1 | 11/2003 | Shimomaki et al. | |
| 6,678,017 B1 | 1/2004 | Shimomaki et al. | |
| 2007/0045624 A1* | 3/2007 | Satou et al. | 257/49 |
| 2007/0099396 A1* | 5/2007 | Hirai et al. | 438/460 |
| 2008/0158493 A1* | 7/2008 | Park | 349/139 |
| 2008/0273159 A1* | 11/2008 | Seok et al. | 349/158 |
| 2011/0026099 A1* | 2/2011 | Kwon et al. | 359/296 |

FOREIGN PATENT DOCUMENTS

| | | |
|---|---|---|
| JP | 10-186381 A | 7/1998 |
| JP | 2000-171832 A | 6/2000 |

OTHER PUBLICATIONS

Official Communication issued in International Patent Application No. PCT/JP2011/004797, mailed on Oct. 25, 2011.

* cited by examiner

*Primary Examiner* — Khaja Ahmad
(74) *Attorney, Agent, or Firm* — Keating & Bennett, LLP

(57) ABSTRACT

An active matrix substrate includes: an electrode layer formed on the insulating substrate within a display region; a mark disposed on the insulating substrate within a non-display region, and made of a same material as the electrode layer; a first insulating film directly covering each of the electrode layer and the mark; and a second insulating film covering a part of the first insulating film. Within at least a part of the sealing region, the second insulating film is removed from the insulating substrate. The mark is disposed in the at least the part of the sealing region in which the second insulating film is removed, and is provided to overlap at least a part of the sealing region. A protective film is formed on the insulating substrate to cover a side surface and a surface of the first insulating film covering the mark, the surface of the first insulating film being located opposite from the insulating substrate.

14 Claims, 21 Drawing Sheets

ACTIVE MATRIX SUBSTRATE, METHOD FOR FABRICATING THE SAME, AND DISPLAY DEVICE

TECHNICAL FIELD

The present invention relates to active matrix substrates, methods for fabricating such active matrix substrates, and display devices.

BACKGROUND ART

In general, a liquid crystal display device includes a TFT substrate in which a plurality of thin film transistors (hereinafter referred to as "TFTs") are formed, a counter substrate facing the TFT substrate, and a liquid crystal layer provided between the TFT substrate and the counter substrate. A sealing member is provided between the TFT substrate and the counter substrate to bond the TFT substrate and the counter substrate together, and enclose a liquid crystal layer.

The liquid crystal display device also includes a display region in which a plurality of pixels are disposed and which contributes to display, and a non-display region which surrounds the display region. The sealing member is disposed in the non-display region.

The TFT substrate includes a glass substrate on which the TFTs etc. are formed. On the glass substrate, an interlayer insulating film is formed to cover the TFTs, and a pixel electrode made of indium tin oxide (ITO) is formed on the surface thereof. The interlayer insulating film is made of an organic insulating film of, e.g., a photosensitive acrylic resin etc.

Patent Document 1 discloses, in order to improve the bond strength between a sealing member and a TFT substrate, removing an interlayer insulating film made of an organic insulating film in a region in which the sealing member is formed to expose a glass substrate or an inorganic insulating film (a passivation film, a gate insulating film, etc.) which constitutes the TFT substrate.

Patent Document 2 discloses, as illustrated in FIG. 53, that a TFT substrate 100 is provided with, on the flat surface of an overcoat film 109 covering a TFT 105 and a signal line 107, a protective film 110 overlapping a region slightly larger than a region in which the signal line 107 and a drain electrode 103 of the TFT 105 overlap with each other, and the protective film 110 is made of the same material (ITO) as the pixel electrode 104. With this configuration, even if the overcoat film 109 has damage, a discontinuity of the signal line 107 does not occur under the defect.

CITATION LIST

Patent Document

PATENT DOCUMENT 1: Japanese Patent Publication No. H10-186381
PATENT DOCUMENT 2: Japanese Patent Publication No. 2000-171832

SUMMARY OF THE INVENTION

Technical Problem

It has been known that a predetermined mark is formed on a non-display region of a TFT substrate. The mark is, for example, a mark for alignment between a TFT substrate and a counter substrate, a mark for measuring an amount of displacement between the TFT substrate and a counter substrate, and a mark for, when cutting a glass substrate, measuring an amount of displacement of a cutting line, etc. The mark can be made of the same material as a gate line.

Recently, the size of a non-display region has been reduced, and a ratio of a sealing member to the non-display region in the TFT substrate has been increased. Therefore, it is desired to dispose the mark so that the mark overlaps the sealing member.

However, as disclosed in Patent Document 1, if the interlayer insulating film is removed in a region in which the sealing member is disposed to improve the bond strength between the sealing member and the TFT substrate, the mark is not covered with the interlayer insulating film, and is covered with only a gate insulating film and a semiconductor layer, for example. Accordingly, if a pinhole and a crack occur in the gate insulating film etc., an etchant may pass through the gate insulating film etc. during etching of a material of a pixel electrode covering the gate insulating film etc. As a result, the mark is disadvantageously etched by the etchant, resulting in damage of the mark and vanishment of the mark.

In view of the foregoing, the present invention has been developed. It is an objective of the present invention to prevent damage of a mark provided in a non-display region while reducing the size of the non-display region.

Solution to the Problem

In order to achieve the above object, an active matrix substrate according to the present invention is directed to an active matrix substrate which constitutes a display device by being bonded to a counter substrate through a frame-shaped sealing member. The display device includes: a display region provided within a frame-shaped sealing region in which the sealing member is provided; and a frame-shaped non-display region formed outside the display region, and including the sealing region.

The active matrix substrate includes: an electrode layer formed on the insulating substrate within the display region; a mark disposed on the insulating substrate within the non-display region, and made of a same material as the electrode layer; a first insulating film directly covering each of the electrode layer and the mark; and a second insulating film covering a part of the first insulating film, wherein within at least a part of the sealing region, the second insulating film is removed from the insulating substrate, the mark is disposed in the at least the part of the sealing region in which the second insulating film is removed, and is provided to overlap at least a part of the sealing region, and a protective film is formed on the insulating substrate to cover a side surface and a surface of the first insulating film covering the mark, the surface of the first insulating film being located opposite from the insulating substrate.

The method of fabricating an active matrix substrate according to the present invention is directed to a method of an active matrix substrate which constitutes a display device by being bonded to a counter substrate through a frame-shaped sealing member. The display device includes: a display region provided within a frame-shaped sealing region in which the sealing member is provided; and a frame-shaped non-display region formed outside the display region, and including the sealing region.

The method includes the steps of: forming an electrode layer on the insulating substrate within the display region, and forming a mark, which is made of a same material as the electrode layer, on the insulating substrate within the non-display region to overlap the sealing region; forming a first insulating film directly covering each of the electrode layer and the mark on the insulating substrate; forming a second insulating film covering a part of the first insulating film, the second insulating film within a part of the sealing region in which the mark is formed being removed; and forming a protective film covering a side surface and a surface of the first insulating film covering the mark, the surface of the first insulating film being located opposite from the insulating substrate, by forming a material layer covering the first insulating film and the second insulating film on the insulating substrate, and then, forming a resist pattern on a surface of the material layer, and etching the material layer exposed from the resist pattern.

Advantages of the Invention

According to the present invention, even if a first insulating film covering a mark has, for example, a pinhole, a crack, etc., during etching of a material layer, the first insulating film is covered with a protective film (material layer) and a resist pattern, thereby making it possible to prevent damage of the mark due to passage of an etchant through the first insulating film.

The resist pattern is formed so that a side surface and a surface of the first insulating film covering the mark are covered with the protective film, the surface of the first insulating film being located opposite from the insulating substrate, and therefore, it is possible to cover the first insulating film with the resist pattern even in a region near an edge portion of the mark in which the thickness of the first insulating film is particularly likely to be thinner. As a result, it is possible to reliably prevent damage of the mark while disposing the mark in a sealing region and reducing the size of a non-display region.

DESCRIPTION OF EMBODIMENTS

Embodiments of the present invention will be described hereinafter with reference to the drawings. The present invention is not limited to the following embodiments.

<<First Embodiment>>

FIGS. 1 to 44 illustrate a first embodiment of the present invention.

Figure 1:
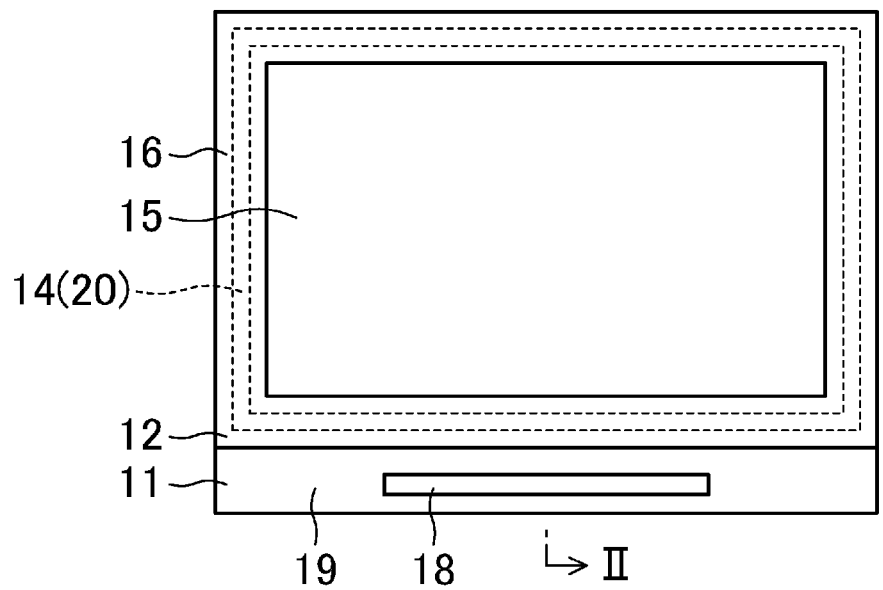
FIG. 1 is a plan view illustrating a main part of a liquid crystal display device of a first embodiment.
Figure 2:
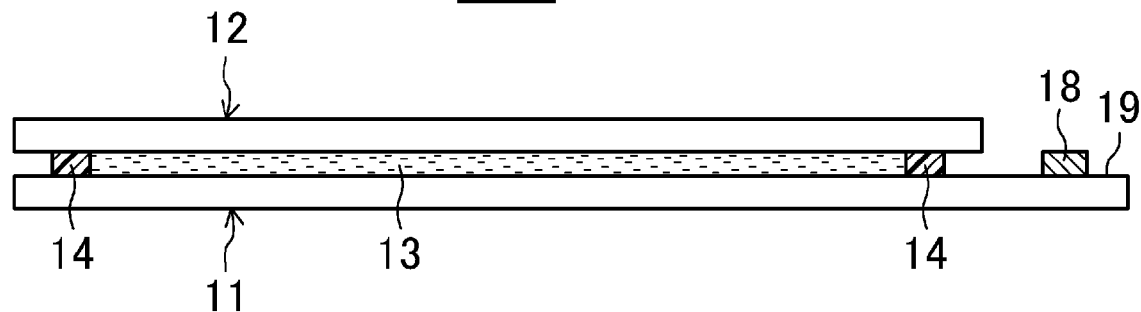
FIG. 2 is a plan view of a TFT substrate according to the embodiment of the present invention.
Figure 3:
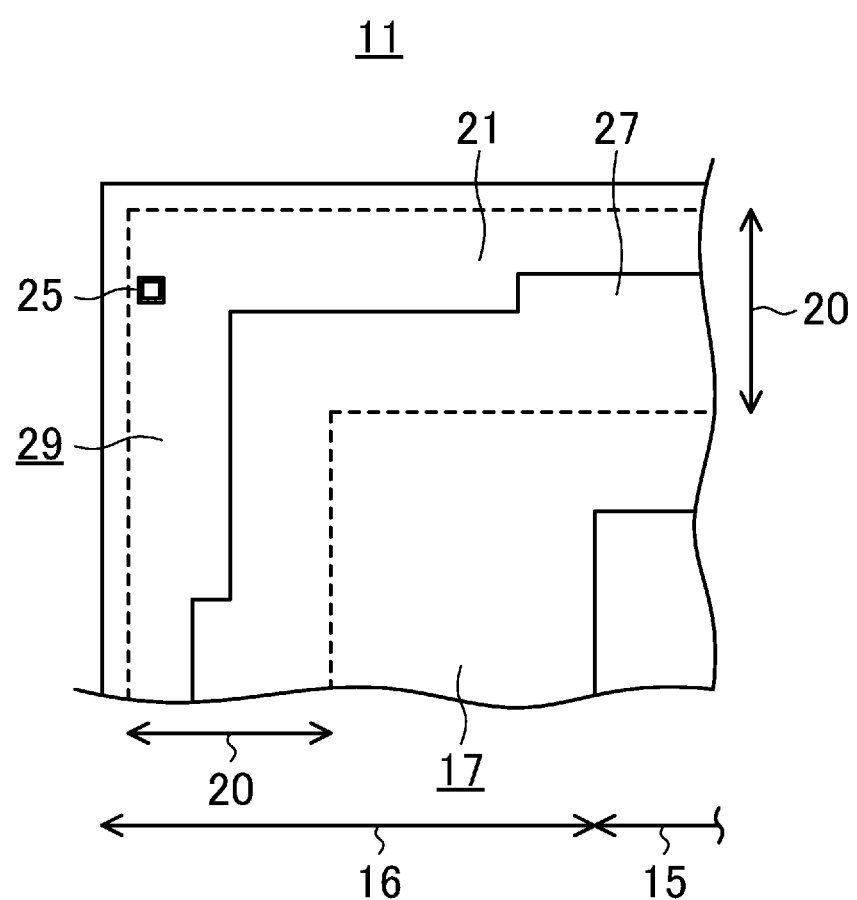
FIG. 3 is an enlarged plan view illustrating a corner portion of a TFT substrate.
Figure 4:
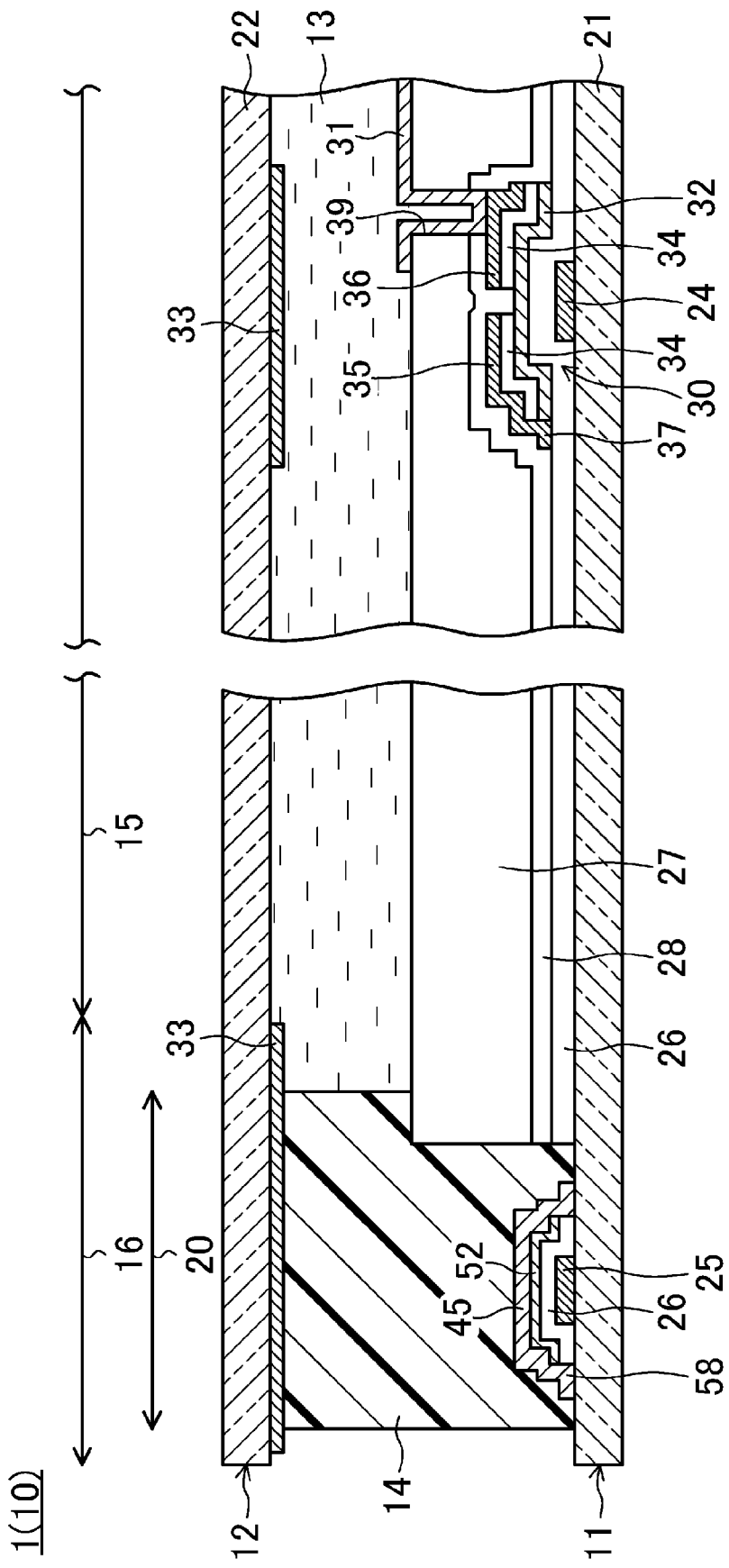
FIG. 4 is an enlarged cross-sectional view illustrating a main configuration of the liquid crystal display device.

FIG. 1 is a plan view illustrating a main part of a liquid crystal display device 1 of a first embodiment. FIG. 2 is a cross-sectional view illustrating a main configuration of the liquid crystal display device 1. FIG. 3 is an enlarged plan view illustrating a corner portion of a TFT substrate 11. FIG. 4 is an enlarged cross-sectional partial view illustrating a main configuration of the liquid crystal display device 1.

Figure 5:
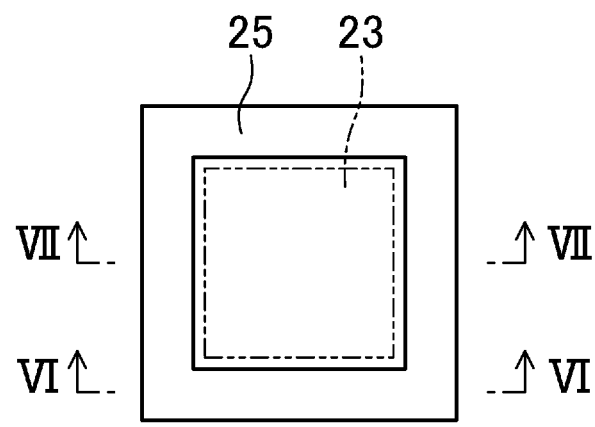
FIG. 5 is an enlarged plan view illustrating a region of the TFT substrate in which a mark is formed.
Figure 6:
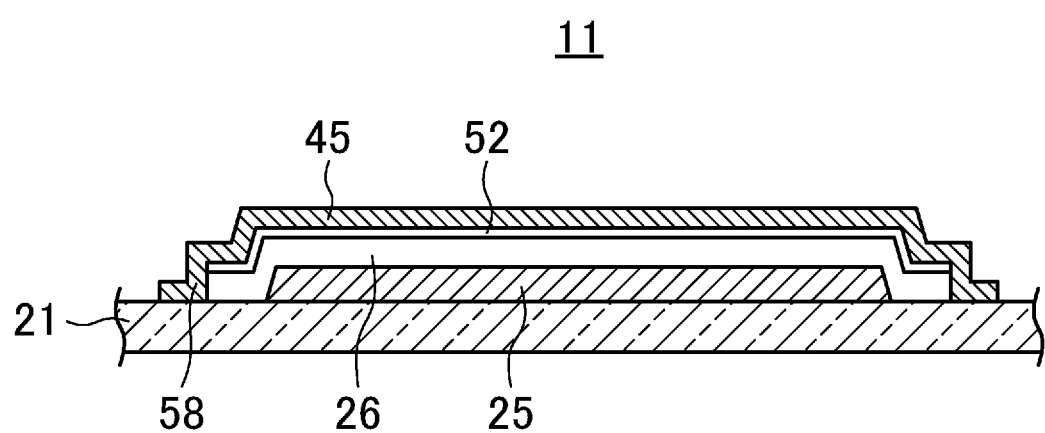
FIG. 6 is a cross-sectional view of the TFT substrate including a cross section taken along the line VI-VI in FIG. 5.
Figure 7:
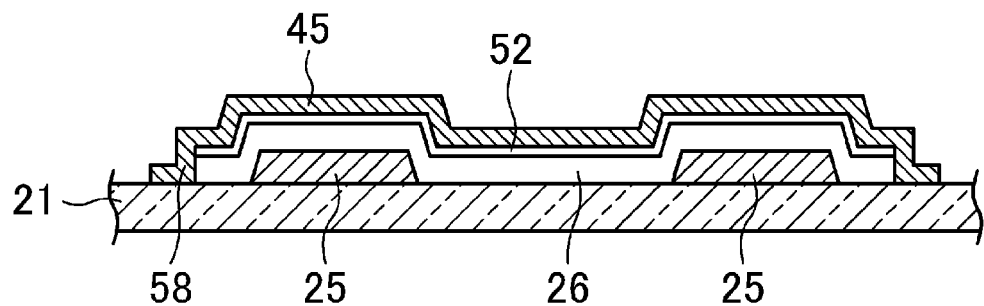
FIG. 7 is a cross-sectional view of the TFT substrate including a cross section taken along the line VII-VII in FIG. 5.
Figure 8:
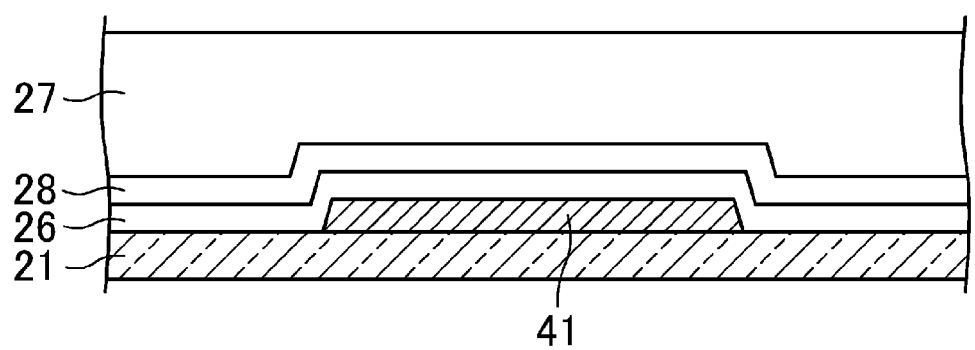
FIG. 8 is a cross-sectional view illustrating a wiring portion made of a gate material in a peripheral wiring region.
Figure 9:
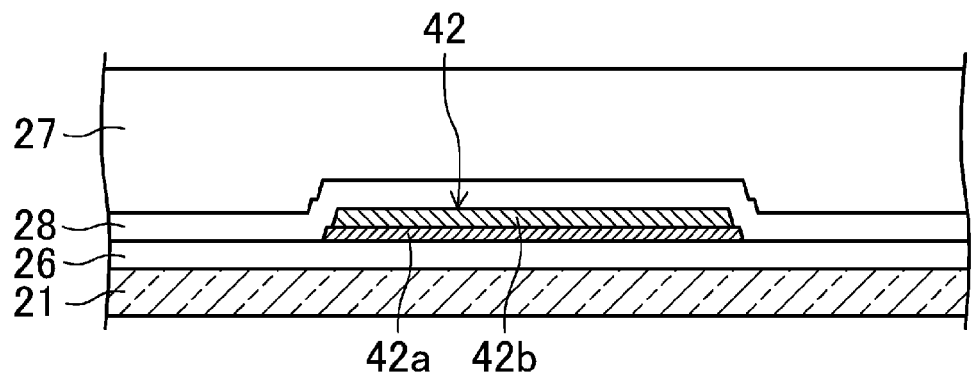
FIG. 9 is a cross-sectional view illustrating a wiring portion made of a source material in the peripheral wiring region.

FIG. 5 is an enlarged plan view illustrating a region of the TFT substrate 11 in which a mark 25 is formed. FIG. 6 is a cross-sectional view of the TFT substrate 11 including a cross section taken along the line VI-VI in FIG. 5. FIG. 7 is a cross-sectional view of the TFT substrate 11 including a cross section taken along the line VII-VII in FIG. 5. FIG. 8 is a cross-sectional view illustrating a wiring portion made of a gate material in a peripheral wiring region 17. FIG. 9 is a cross-sectional view illustrating a wiring portion made of a source material in the peripheral wiring region 17.

Figure 43:
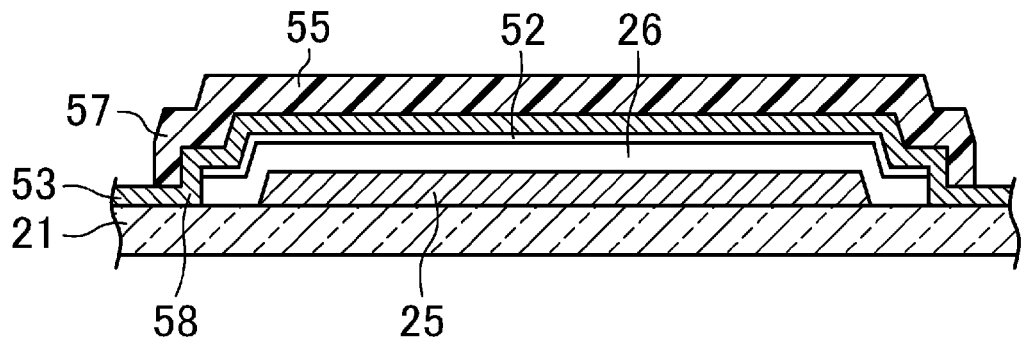
FIG. 43 is a cross-sectional view illustrating a transparent conductive film covered with a resist layer before etching is performed.
Figure 44:
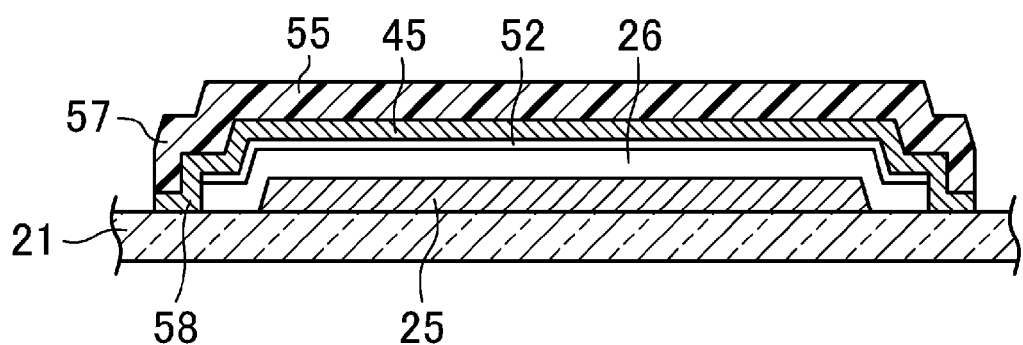
FIG. 44 is a cross-sectional view illustrating a protective film covered with a resist pattern after etching is performed.

FIG. 43 is a cross-sectional view illustrating a transparent conductive film covered with a resist layer 54 before etching is performed. FIG. 44 is a cross-sectional view illustrating a protective film 45 covered with a resist pattern 55 after etching is performed.

In this embodiment, the liquid crystal display device 1 including the TFT substrate 11 serving as an active matrix substrate will be described as an example of a display device.

The liquid crystal display device 1 includes a liquid crystal display panel 10, and a backlight unit (not shown) disposed to face the liquid crystal display panel 10 and serving as an illumination device.

As illustrated in FIGS. 1, 2, and 4, the liquid crystal display panel 10 includes: the TFT substrate 11 which is an active matrix substrate and which serves as a first substrate; a counter substrate 12 which is disposed to face the TFT substrate 11 and which serves as a second substrate; and a liquid crystal layer 13 enclosed between the TFT substrate 11 and the counter substrate 12.

The counter substrate 12 includes a rectangular glass substrate 22 which serves as an insulating substrate, and in which a color filer (not shown) and a common electrode (not shown), etc., are formed.

A frame-shaped sealing member 14 is disposed between the TFT substrate 11 and the counter substrate 12 to bond the TFT substrate 11 and the counter substrate 12 together. The liquid crystal layer 13 is surrounded by the sealing member 14. The sealing member 14 is made of, for example, an ultraviolet curable epoxy resin.

As illustrated in FIGS. 1, 3, and 4, the liquid crystal display panel 10 also includes: a display region 15 disposed within a frame-shaped sealing region 20 in which the sealing member 14 is provided; and a frame-shaped non-display region 16 formed outside the display region 15 and including the sealing region 20.

An alignment film (not shown) is formed on each of surfaces of the TFT substrate 11 and the counter substrate 12 which are located closer to the liquid crystal layer 13.

The display region 15 is a region in which an image is displayed, and in the display region 15, a plurality of pixels (not shown) are formed in matrix. As illustrated in FIG. 3, in the non-display region 16, the peripheral wiring region 17 is formed between the sealing region 20 and the display region 15.

The TFT substrate 11 includes the rectangular glass substrate 21 in which a plurality of source lines (not shown) extending in parallel with each other, and a plurality of gate lines (not shown) orthogonal to the source lines and extending in parallel with each other are formed. In the glass substrate 21, a plurality of Cs lines (not shown) each extending along an associated one of the gate lines are formed. The Cs line is a line configured to apply a predetermined voltage to an auxiliary capacitor formed in each of the pixels.

In a part of the non-display region 16 located at one side of the TFT substrate 11, a plurality of terminals (not shown), and a terminal region 19 on which a driver chip 18 for driving the liquid crystal display panel 10 is mounted are formed.

As illustrated in FIGS. 8 and 9, a first wiring portion 41 including lead lines (not shown) made of the same material as the gate lines, COM lines (not shown), and inspection lines (not shown), etc., and a second wiring portion 42 including lead lines (not shown) made of the same material as the source lines, Cs trunk lines (not shown), and inspection lines (not shown), etc., are formed in the peripheral wiring region 17. The COM line is a line configured to apply a predetermined voltage to the common electrode of the counter substrate 12. The Cs trunk lines are trunk lines connected to the plurality of Cs lines.

As illustrated in FIG. 4, a pixel electrode 31 and a thin-film transistor (TFT) 30 connected to the pixel electrode 31 are formed on the glass substrate 21 in each of the pixels.

The TFT 30 is, for example, a bottom gate-type TFT, and includes: a gate electrode 24 formed on the surface of the glass substrate 21 within the display region 15, and serving as an electrode layer; a gate insulating film 26 directly covering each of the gate electrode 24, and serving as a first insulating film; and a semiconductor layer 32 formed on the surface of the gate insulating film 26.

The gate electrode 24 is made of, e.g., a single-layer film of Al alloy, or an Al film, a Cu film, a Mo film, a Ti film or a multilayer film thereof. The gate insulating film 26 is made of an inorganic insulating film of, e.g., a silicon nitride film ($SiN_x$ film) etc., which have a thickness of about 0.4 μm. The semiconductor layer 32 is made of, e.g., intrinsic amorphous silicon and $n^+$ amorphous silicon, etc.

An ohmic contact layer 34 is formed at both sides of the semiconductor layer 32 on the surface of the semiconductor layer 32. The ohmic contact layer 34 is made of, e.g., $n^+$ silicon.

A black matrix 33 is formed on a region of the counter substrate 12 facing the semiconductor layer 32. The black matrix 33 is made of a black resin film, a metal film having a low reflectance, etc.

A source electrode 35 and a drain electrode 36 are formed on the surface of the ohmic contact layer 34. Moreover, a source line 37 connected to the source electrode 35 is formed on the surface of the gate insulating film 26. The source line 37, the source electrode 35, and the drain electrode 36 are made of, e.g., a multilayer film of Al alloy and Mo, or an Al film, a Cu film, a Mo film, a Ti film or a multilayer film thereof.

The TFT substrate 11 in this embodiment has a so-called Pixel On Pas structure, and a part of the source lines 37, a part of the source electrode 35, a part of the drain electrode 36, and a part of the gate insulating film 26 are covered with a passivation film 28 and an interlayer insulating film 27 serving as a second insulating film. The passivation film 28 is made of, e.g., a silicon nitride film, and is formed to have a thickness of 0.1-0.7 μm, e.g., approximately 0.3 μm. The interlayer insulating film 27 is made of, e.g., an organic insulating film of a photosensitive acrylic resin etc., and is formed on the surface of the passivation film 28 to have a thickness of 1.0-4.0 μm, e.g., approximately 3.0 μm.

In the interlayer insulating film 27 and the passivation film 28, a contact hole 39 is formed above the drain electrode 36 to penetrate the interlayer insulating film 27 and the passivation film 28. Within the display region 15, a pixel electrode 31 made of a transparent conductive film of ITO etc. is formed on the surface of the interlayer insulating film 27. The pixel electrode 31 is connected to the drain electrode 36 through the contact hole 39.

Within the non-display region 16, the mark 25 made of the same material as the gate electrode 24 is disposed on the glass substrate 21. The mark 25 is an alignment mark used for alignment between the TFT substrate and the counter substrate 12.

As illustrated in FIG. 5, the mark 25 is formed to be patterned into, e.g., a rectangular ring shape when viewed from the normal direction of the surface of the glass substrate 21. One side of the outer shape of the mark 25 has a length of, e.g., 180 μm, and one side of the inner shape thereof has a length of, e.g., 122 μm.

In contrast, within the non-display region 16, a mark 23 is formed on the counter substrate 12. The mark 23 is made of the same material as, e.g., the black matrix 33 and is formed in a square shape whose one side has a length of 100 μm. The counter substrate 12 is aligned with the TFT substrate 11 so that the mark 23 is disposed within the mark 25.

For example, when an amount of displacement in the right-left direction is measured, the distance between the center line of the mark 23 in the right-left direction and the center line of the mark 25 in the right-left direction is measured by an automatic measuring device (not shown). With the distance measurement, the amount of displacement is measured. A gap of 11 μm is provided between the outer edge portion of the mark 23 and the inner edge portion of the mark 25 in a state where the marks 23 and 25 are not displaced from each other so that the automatic measuring device does not mistakenly examine the marks 23 and 25. Another pattern is not located within 50 μm of the peripheries of the marks 23 and 25.

Within the non-display region 16A, the gate insulating film 26 which is a first insulating film directly covering the mark 25 is formed on the glass substrate 21. The gate insulating film 26 covering the mark 25 is formed to be separated from the gate insulating film 26 covering the gate electrode 24 of the TFT 30.

As illustrated in FIGS. 3 and 4, within the sealing region 20, at least a part of the interlayer insulating film 27 is removed from the glass substrate 21. In other words, at least a part of a removed region 29 in which the interlayer insulating film 27 is removed overlaps the sealing region 20. In the removed region 29, the peripheral wiring region 17 is not formed. In other words, the peripheral wiring region 17 is formed in the non-display region 16 except the removed region 29.

In general, the organic insulating film which is the interlayer insulating film 27 and the sealing member 14 are relatively weakly bonded to each other. However, in the foregoing manner, by removing the interlayer insulating film 27 in at least a part of the sealing region 20, it is possible to improve the bond strength between the sealing member 14 and the TFT substrate 11.

The mark 25 is disposed in a region within which the interlayer insulating film 27 is removed to overlap at least a part of the sealing region 20. Moreover, as illustrated in FIGS. 4, 6, and 7, the protective film 45 covering the entirety of the side surface of the gate insulating film 26 covering the mark 25, and a surface of the gate insulating film 26 closer to the counter substrate 12 (in other words, a surface of the gate insulating film 26 covering the mark 25 and located opposite from the insulating substrate 21) is formed on the glass substrate 21. In other words, the gate insulating film 26 covering the mark 25 is fully covered with the protective film 45. The protective film 45 in this embodiment directly covers the side surface of the gate insulating film 26 covering the mark 25.

The protective film 45 is made of ITO etc., which is the same material as the pixel electrode 31. Moreover, the outer edge portion of the protective film 45 is formed on the surface of the glass substrate 21. A semiconductor layer 52 made of the same material as the semiconductor layer 32 of the TFT 30 is disposed between the protective film 45 and the gate insulating film 26 covering the mark 25.

-Fabrication Method-

Next, a method for fabricating the TFT substrate 11 and the liquid crystal display device 1 will be described. The liquid crystal display device 1 is fabricated by aligning the TFT substrate 11 and the counter substrate 12, which are formed in advance, with each other through the liquid crystal layer 13 and the sealing member 14.

For example, the sealing member 14 is applied in the shape of a rectangular frame onto the counter substrate 12, and a liquid crystal material is supplied by being dropped onto a region within the frame of the sealing member 14. Next, the counter substrate 12 which has been aligned by using the mark 25 is bonded to the TFT substrate 11. Thereafter, the sealing member 14 is irradiated with ultraviolet light to cure the sealing member 14. In the foregoing manner, the liquid crystal display device 1 is fabricated.

The sealing member 14 may be applied onto the TFT substrate 11, not onto the counter substrate 12.

In this embodiment, injection of the liquid crystal material is described by using the dropping method. Alternatively, the injection may be performed by using a method of forming an injection port (not shown) in a frame-shaped sealing member, performing a dipping vacuum injection, and then, sealing the injection port.

The process of fabricating the TFT substrate 11 will be described in detail with reference to FIGS. 10-42. FIGS. 10, 13, 16, 19, 22, 25, 28, 31, 34, 37, and 40 are cross-sectional views illustrating the mark and the vicinity thereof in the process of fabricating the TFT substrate.

FIGS. 11, 14, 17, 20, 23, 26, 29, 32, 35, 38, and 41 are cross-sectional views illustrating the wiring portion made of the gate material and the vicinity thereof in the process of fabricating the TFT substrate. FIGS. 12, 15, 18, 21, 24, 27, 30, 33, 36, 39, and 42 are cross-sectional views illustrating the wiring portion made of the source material and the vicinity thereof in the process of fabricating the TFT substrate.

First, in a first step, by a first photolithography process, the gate electrode 24 is formed on the glass substrate 21 within the display region 15, and the mark 25 made of the same material as the gate electrode 24 is formed on the glass substrate 21 within the non-display region 16 so as to overlap the sealing region 20.

Figure 10:
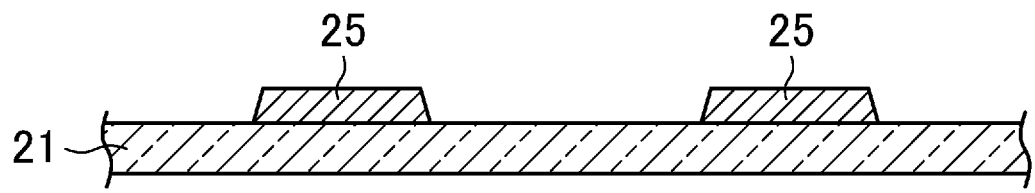
FIG. 10 is a cross-sectional view illustrating the mark and the vicinity thereof in the process of fabricating the TFT substrate.
Figure 11:
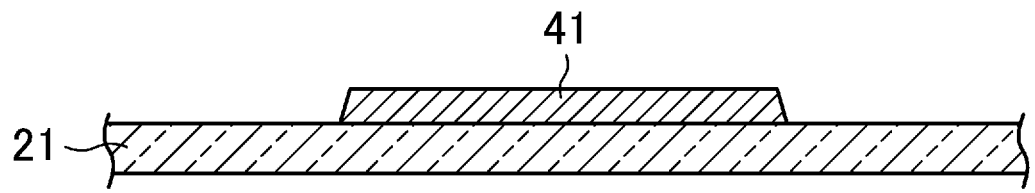
FIG. 11 is a cross-sectional view illustrating the wiring portion made of the gate material and the vicinity thereof in the process of fabricating the TFT substrate.
Figure 12:
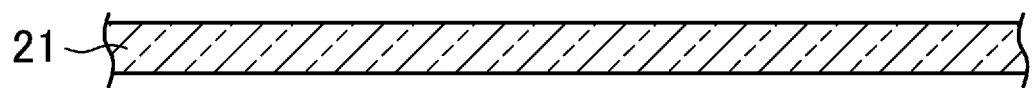
FIG. 12 is a cross-sectional view illustrating the wiring portion made of the source material and the vicinity thereof in the process of fabricating the TFT substrate.

In other words, as illustrated in FIGS. 10-12, within the sealing region 20 of the non-display region 16, the mark 25 made of a single-layer film of, e.g., an Al alloy is formed in a rectangular ring shape on the surface of the glass substrate 21. At the same time, within the display region 15, the gate electrode 24 is formed on the surface of the glass substrate 21, and within the peripheral wiring region 17 of the non-display region 16, the first wiring portion 41 is formed on the surface of the glass substrate 21.

Figure 13:
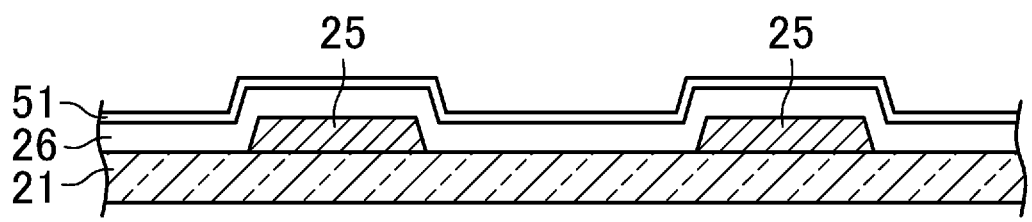
FIG. 13 is a cross-sectional view illustrating the mark and the vicinity thereof in the process of fabricating the TFT substrate.
Figure 14:
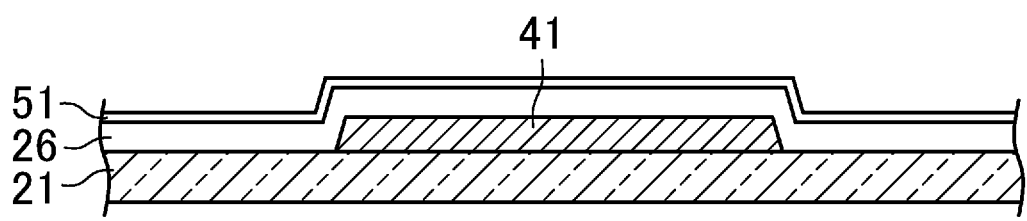
FIG. 14 is a cross-sectional view illustrating the wiring portion made of the gate material and the vicinity thereof in the process of fabricating the TFT substrate.
Figure 15:
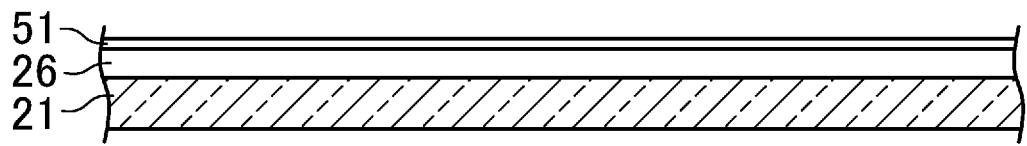
FIG. 15 is a cross-sectional view illustrating the wiring portion made of the source material and the vicinity thereof in the process of fabricating the TFT substrate.

Next, in a second step, as illustrated in FIGS. 13-15, a silicon nitride film is disposed on the glass substrate 21 with a thickness of about 0.4 µm, thereby forming on the glass substrate 21 the gate insulating film 26 directly covering each of the gate electrode 24, the mark 25, and the first wiring portion 41. Moreover, a semiconductor material layer 51 made of, e.g., intrinsic amorphous silicon and $n^+$ amorphous silicon, etc., is formed on the surface of the gate insulating film 26.

Figure 16:
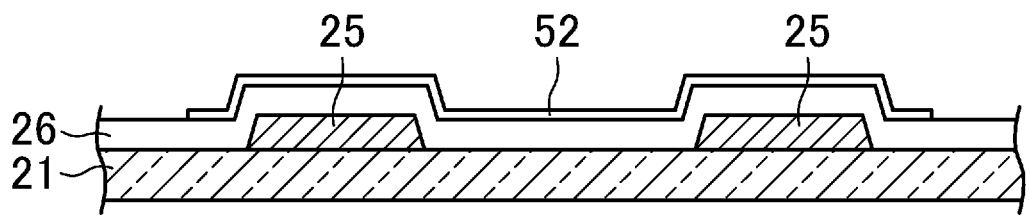
FIG. 16 is a cross-sectional view illustrating the mark and the vicinity thereof in the process of fabricating the TFT substrate.
Figure 17:
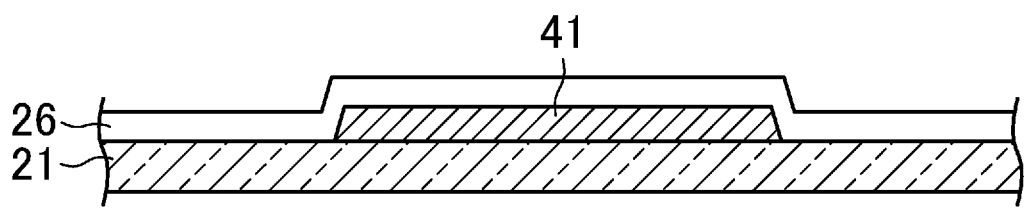
FIG. 17 is a cross-sectional view illustrating the wiring portion made of the gate material and the vicinity thereof in the process of fabricating the TFT substrate.
Figure 18:
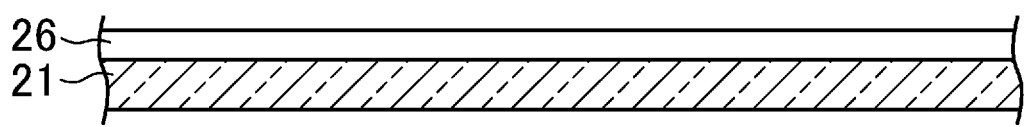
FIG. 18 is a cross-sectional view illustrating the wiring portion made of the source material and the vicinity thereof in the process of fabricating the TFT substrate.

Next, in a third step, as illustrated in FIGS. 16-18, by a second photolithography process, the semiconductor material layer 51 located on the mark 25 and a region in which each of the TFTs 30 is formed is left, whereas the semiconductor material layer 51 located within the non-display region 16 is removed. Therefore, as illustrated in FIGS. 17 and 18, in the peripheral wiring region 17, the gate insulating film 26 is exposed. In this way, the semiconductor layer 32 is formed on the surface of the gate insulating film 26 in the region in which each of the TFTs 30 is formed, and the semiconductor layer 52 is formed on the surface of the gate insulating film 26 to cover the mark 25.

Figure 19:
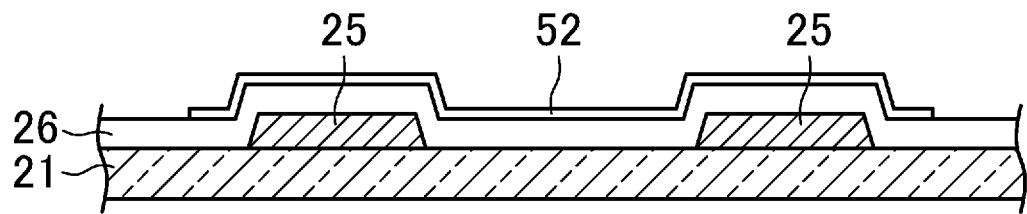
FIG. 19 is a cross-sectional view illustrating the mark and the vicinity thereof in the process of fabricating the TFT substrate.
Figure 20:
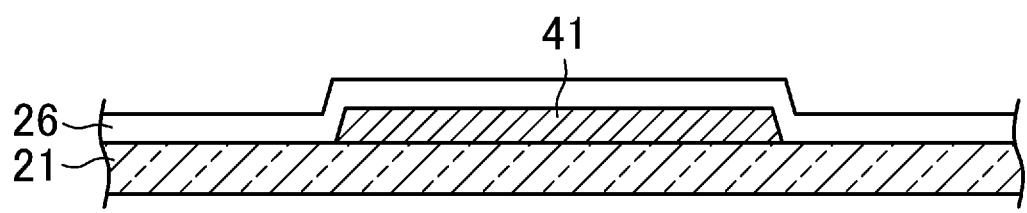
FIG. 20 is a cross-sectional view illustrating the wiring portion made of the gate material and the vicinity thereof in the process of fabricating the TFT substrate.
Figure 21:
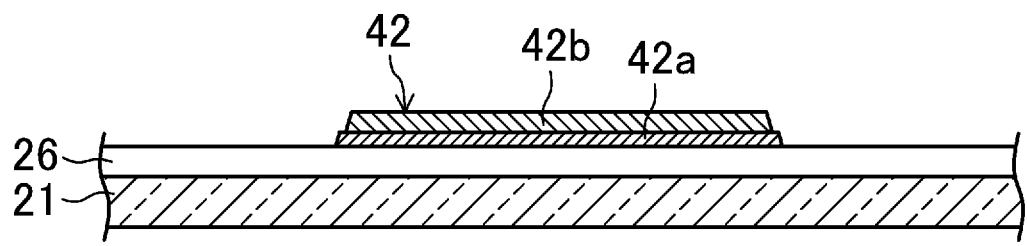
FIG. 21 is a cross-sectional view illustrating the wiring portion made of the source material and the vicinity thereof in the process of fabricating the TFT substrate.

Next, in a fourth step, as illustrated in FIGS. 19-21, by a third photolithography process, the second wiring portion 42 is formed on the surface of the gate insulating film 26 within the peripheral wiring region 17 of the non-display region 16. On the gate insulating film 26, the second wiring portion 42 is formed by sequentially disposing, e.g., an Al alloy film 42a and a Mo film 42b, and performing photolithography.

Figure 22:
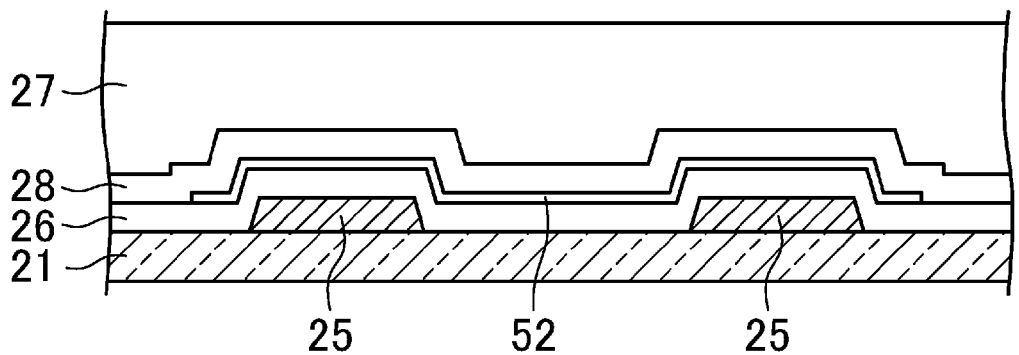
FIG. 22 is a cross-sectional view illustrating the mark and the vicinity thereof in the process of fabricating the TFT substrate.
Figure 23:
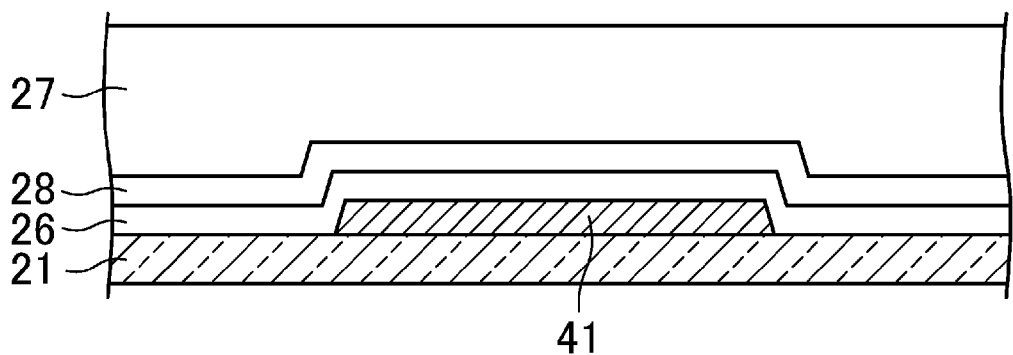
FIG. 23 is a cross-sectional view illustrating the wiring portion made of the gate material and the vicinity thereof in the process of fabricating the TFT substrate.
Figure 24:
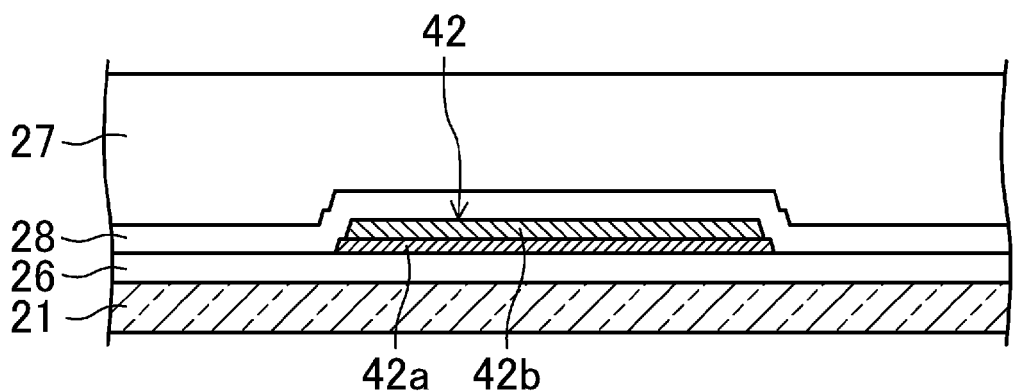
FIG. 24 is a cross-sectional view illustrating the wiring portion made of the source material and the vicinity thereof in the process of fabricating the TFT substrate.

Next, in a fifth step, as illustrated in FIGS. 22-24, the passivation film 28 and the interlayer insulating film (organic insulating film) 27 are sequentially stacked on the entirety of the glass substrate 21. The passivation film 28 is made of a silicon nitride film having a thickness of about 0.3 µm. The interlayer insulating film 27 is made of a photosensitive acrylic resin having a thickness of about 3.0 µm.

Figure 25:
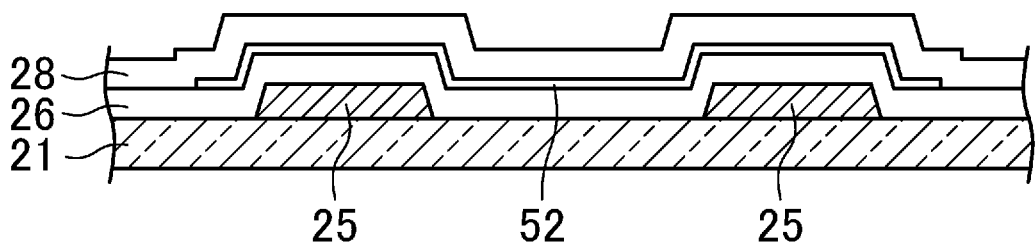
FIG. 25 is a cross-sectional view illustrating the mark and the vicinity thereof in the process of fabricating the TFT substrate.
Figure 26:
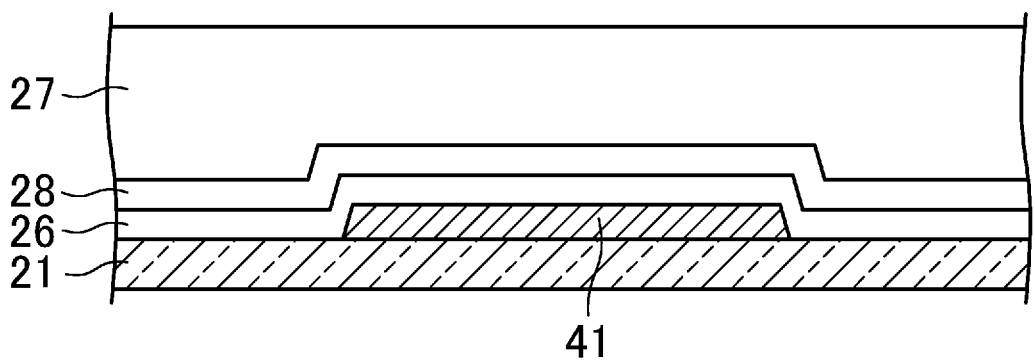
FIG. 26 is a cross-sectional view illustrating the wiring portion made of the gate material and the vicinity thereof in the process of fabricating the TFT substrate.
Figure 27:
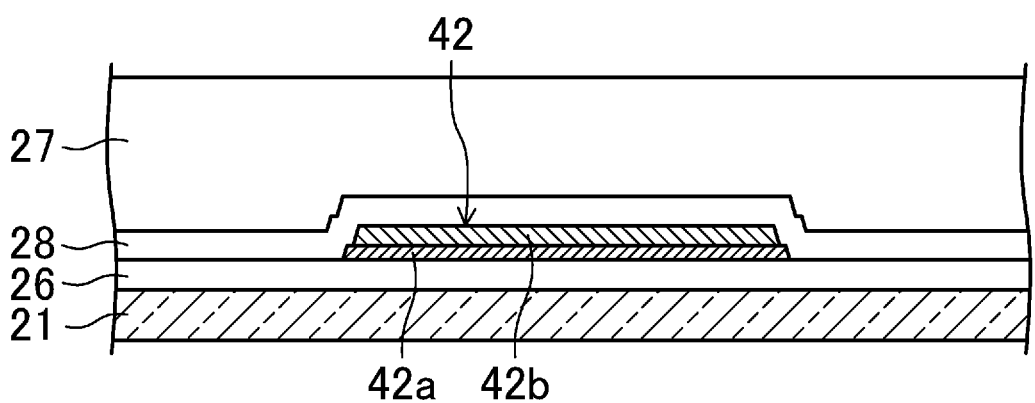
FIG. 27 is a cross-sectional view illustrating the wiring portion made of the source material and the vicinity thereof in the process of fabricating the TFT substrate.

Next, in a sixth step, as illustrated in FIGS. 25-27, by a fourth photolithography process, a part of the interlayer insulating film 27 is removed within the non-display region 16, thereby forming the removed region 29. In this way, the interlayer insulating film 27 is formed, which covers a part of the gate insulating film 26, and at least a part of which is removed within the sealing region 20 and the region in which the mark 25 is formed.

Figure 28:
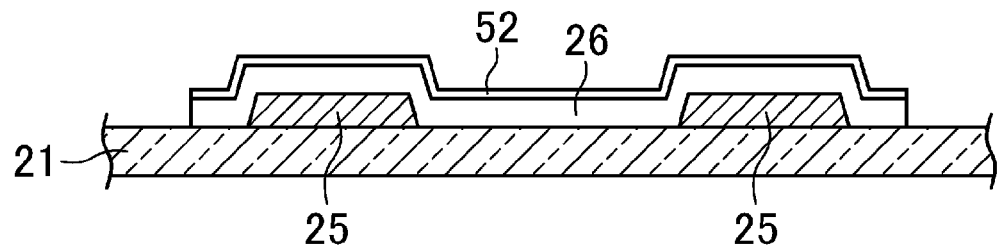
FIG. 28 is a cross-sectional view illustrating the mark and the vicinity thereof in the process of fabricating the TFT substrate.
Figure 29:
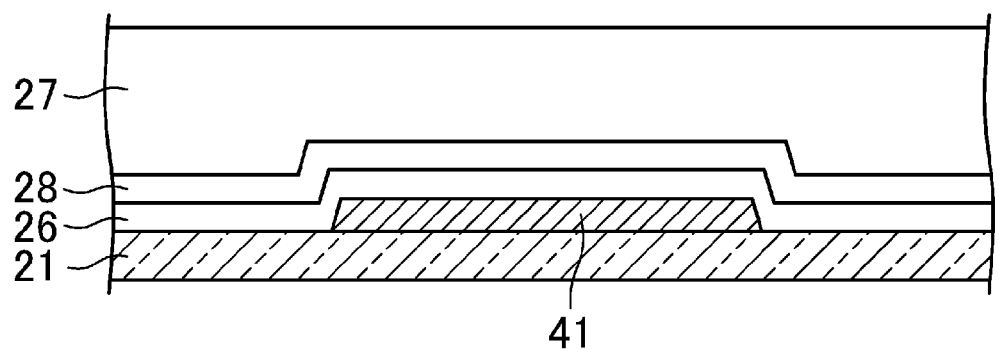
FIG. 29 is a cross-sectional view illustrating the wiring portion made of the gate material and the vicinity thereof in the process of fabricating the TFT substrate.
Figure 30:
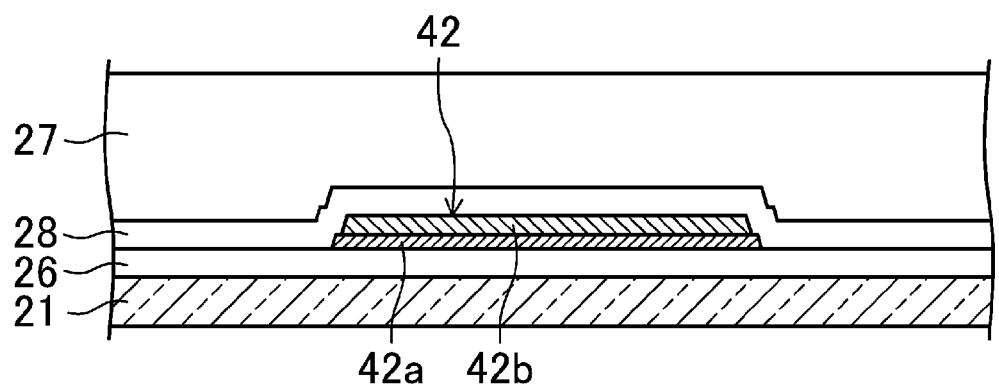
FIG. 30 is a cross-sectional view illustrating the wiring portion made of the source material and the vicinity thereof in the process of fabricating the TFT substrate.

Next, in a seventh step, as illustrated in FIGS. 28-30, in the region in which the interlayer insulating film 27 has been removed, the passivation film 28 is etched to be removed, and the gate insulating film 26 which is not covered with the semiconductor layer 52 is also etched to be removed in the same step. At this time, the semiconductor layer 52 can be used as mask. When the gate insulating film 26 is etched, a part of the semiconductor layer 52 is also etched, and therefore, the thickness of the semiconductor layer 52 is made thinner.

Figure 31:
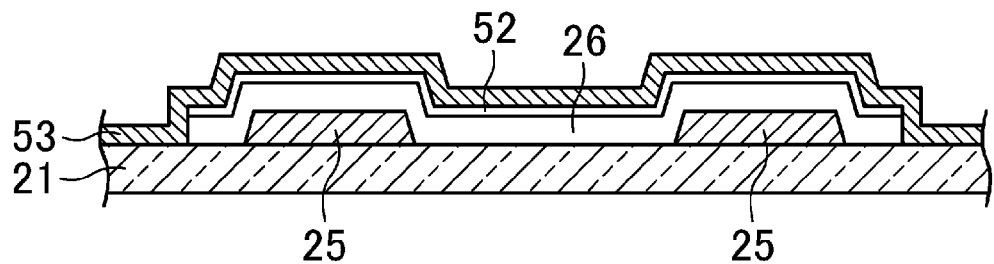
FIG. 31 is a cross-sectional view illustrating the mark and the vicinity thereof in the process of fabricating the TFT substrate.
Figure 32:
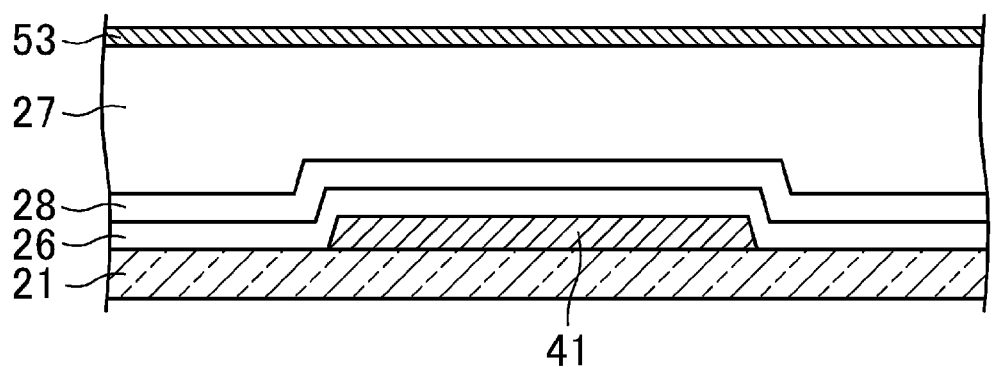
FIG. 32 is a cross-sectional view illustrating the wiring portion made of the gate material and the vicinity thereof in the process of fabricating the TFT substrate.
Figure 33:
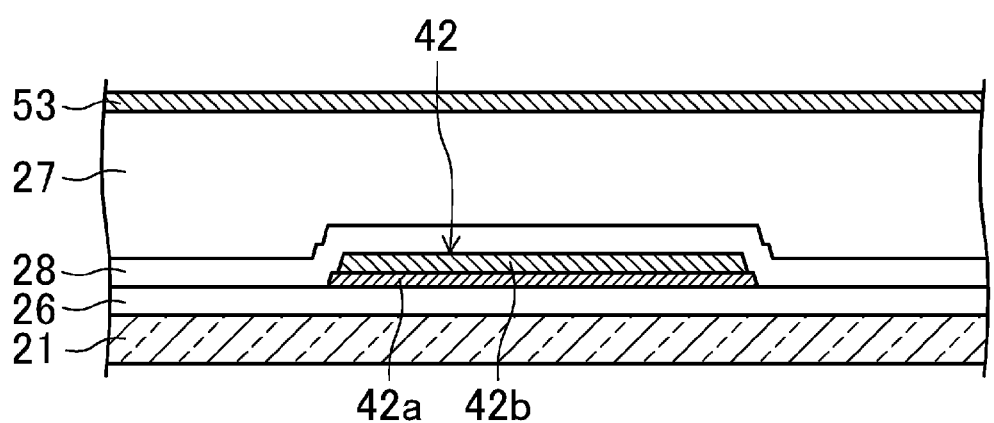
FIG. 33 is a cross-sectional view illustrating the wiring portion made of the source material and the vicinity thereof in the process of fabricating the TFT substrate.

Next, in an eighth step, as illustrated in FIGS. 31-33, a transparent conductive material layer 53 is formed on the glass substrate 21 as a material layer covering the gate insulating film 26 and the interlayer insulating film 27. As the transparent conductive material layer 53, ITO, indium zinc oxide (IZO), etc., can be applied.

Figure 34:
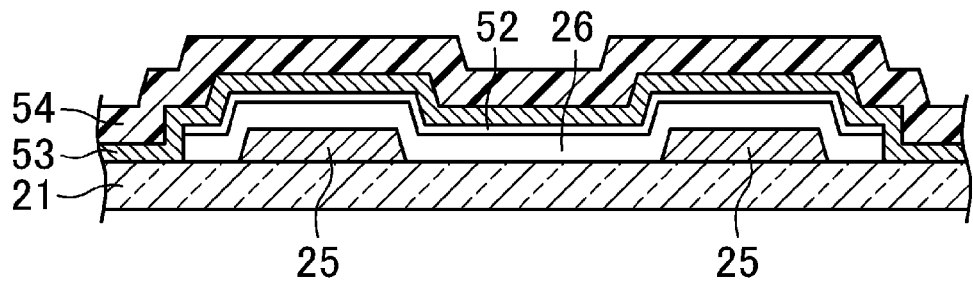
FIG. 34 is a cross-sectional view illustrating the mark and the vicinity thereof in the process of fabricating the TFT substrate.
Figure 35:
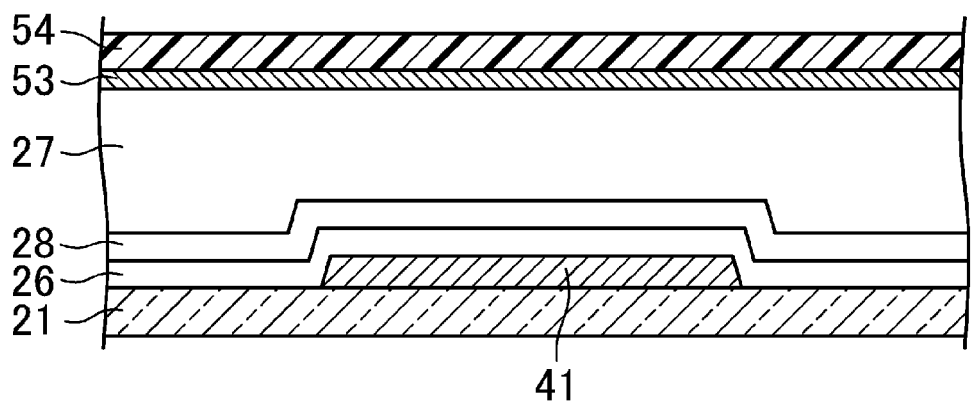
FIG. 35 is a cross-sectional view illustrating the wiring portion made of the gate material and the vicinity thereof in the process of fabricating the TFT substrate.
Figure 36:
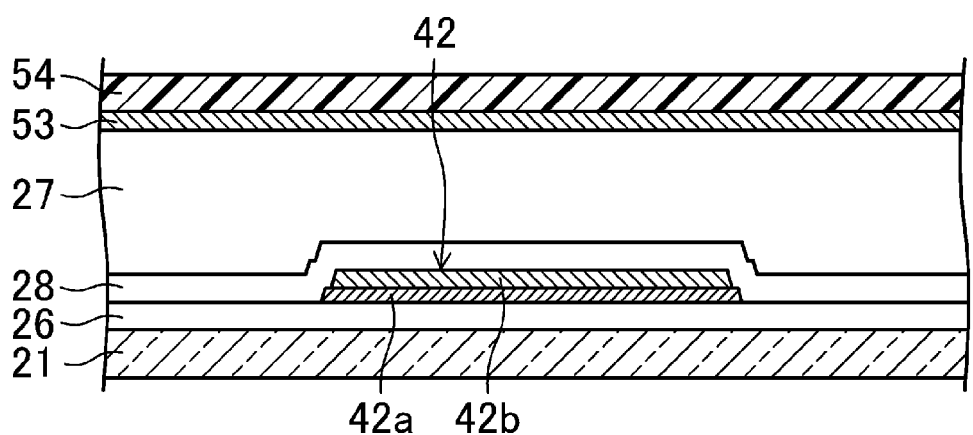
FIG. 36 is a cross-sectional view illustrating the wiring portion made of the source material and the vicinity thereof in the process of fabricating the TFT substrate.

Thereafter, in a ninth step, as illustrated in FIGS. 34-36, a resist material is applied onto the surface of the transparent conductive material layer 53, thereby forming the resist layer 54.

Figure 37:
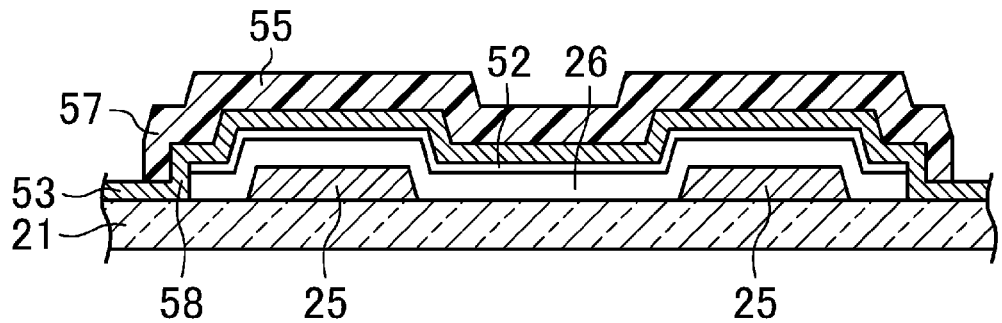
FIG. 37 is a cross-sectional view illustrating the mark and the vicinity thereof in the process of fabricating the TFT substrate.
Figure 38:
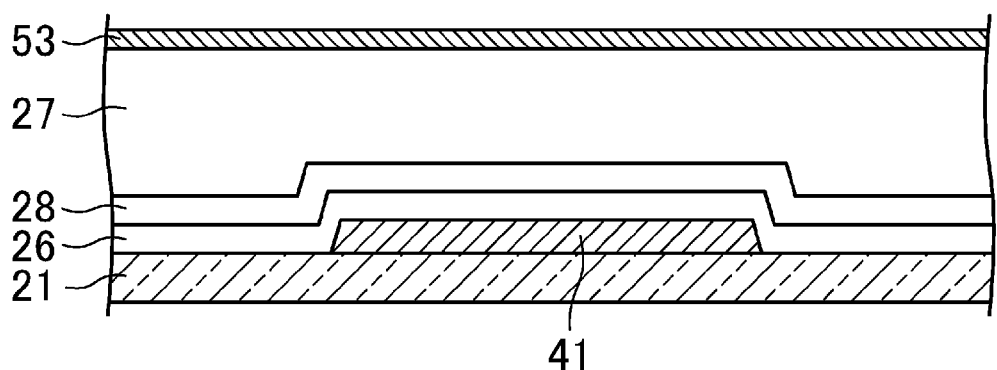
FIG. 38 is a cross-sectional view illustrating the wiring portion made of the gate material and the vicinity thereof in the process of fabricating the TFT substrate.
Figure 39:
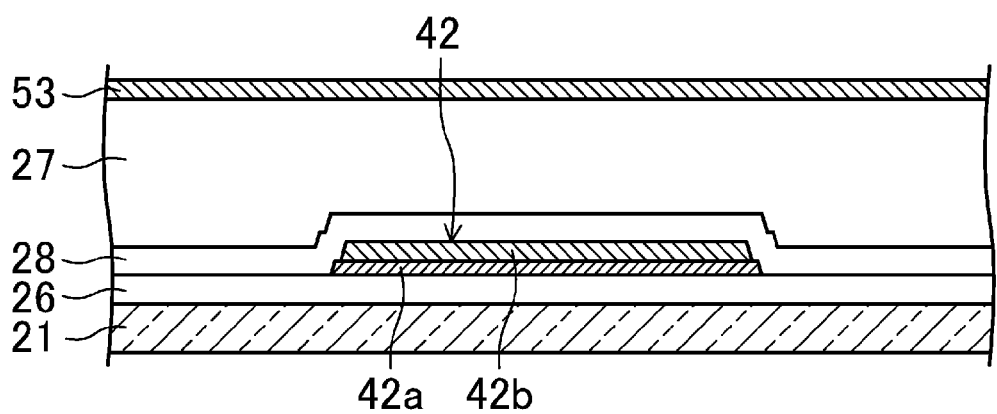
FIG. 39 is a cross-sectional view illustrating the wiring portion made of the source material and the vicinity thereof in the process of fabricating the TFT substrate.
Figure 40:
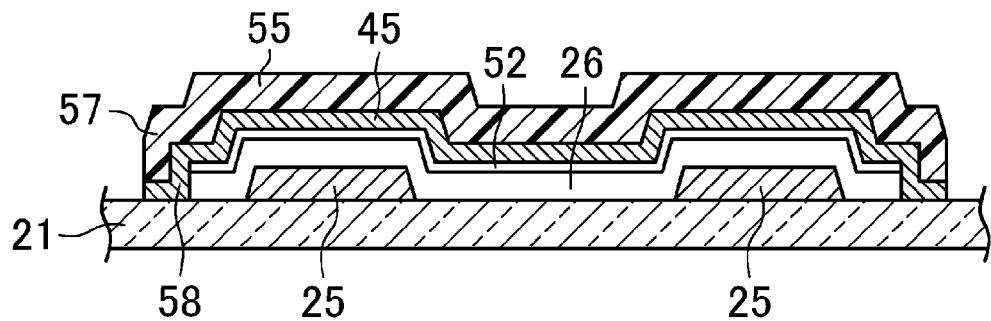
FIG. 40 is a cross-sectional view illustrating the mark and the vicinity thereof in the process of fabricating the TFT substrate.
Figure 41:
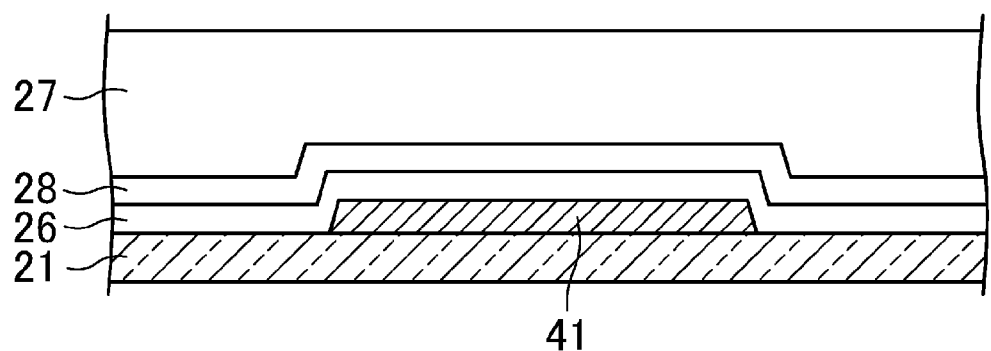
FIG. 41 is a cross-sectional view illustrating the wiring portion made of the gate material and the vicinity thereof in the process of fabricating the TFT substrate.
Figure 42:
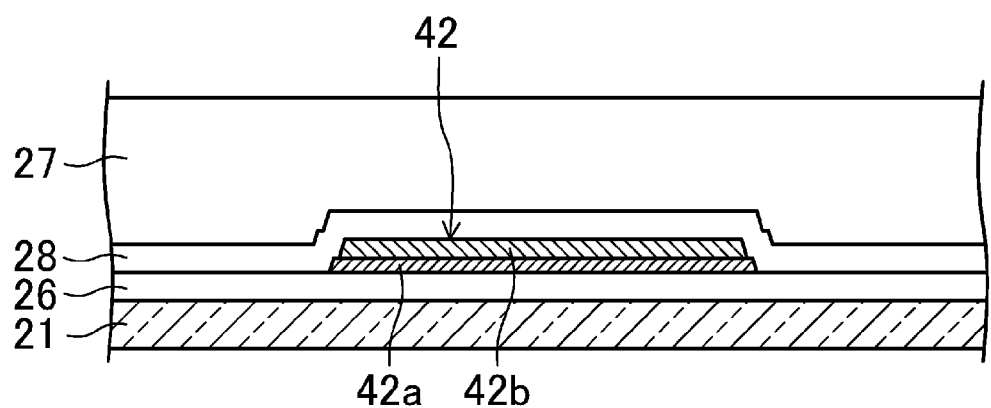
FIG. 42 is a cross-sectional view illustrating the wiring portion made of the source material and the vicinity thereof in the process of fabricating the TFT substrate.

Subsequently, in a tenth step, as illustrated in FIGS. 37-39, and 43, the resist layer 54 is patterned, thereby forming a resist pattern 55 on the surface of the transparent conductive material layer 53. As illustrated in FIG. 37, a side portion 57 of the resist pattern 55 in the sealing region 20 is disposed outside a portion 58 of the transparent conductive material layer 53 covering the side surface of the gate insulating film 26. Within the display region 15, the resist pattern 55 is formed in a region in which each of the pixel electrodes 31 is formed.

Next, in an eleventh step, as illustrated in FIGS. 40-42, and 44, the transparent conductive material layer 53 exposed from the resist pattern 55 is etched, thereby forming the protective film 45 covering the side surface of the gate insulating film 26 covering the mark 25 and a surface of the gate insulating film 26 located closer to the counter substrate 12 (a surface of the first insulating film 26 located opposite from the insulating substrate 21). At this time, the protective film 45 covers the side surface of the semiconductor layer 52 and a surface of the semiconductor layer 52 closer to the counter substrate 12, and is covered with the resist pattern 55. Within the display region 15, the transparent conductive material layer 53 having overlapped the resist pattern 55 forms the pixel electrode 31 on the surface of the interlayer insulating film 27.

Thereafter, the resist pattern 55 is removed from the glass substrate 21, thereby fabricating the TFT substrate 11.

-Advantage of First Embodiment-

Therefore, according to the first embodiment, even if the gate insulating film 26 covering the mark 25 has, e.g., a pinhole, a crack, etc., the gate insulating film 26 is covered with the protective film 45 and the resist pattern 55 during etching of the transparent conductive material layer 53, thereby making it possible to prevent damage of the mark 25 due to passage of an etchant through the gate insulating film 26.

The resist pattern 55 is formed so that the side surface and the surface of the gate insulating film 26 covering the mark 25 are covered with the protective film 45, the surface of the gate insulating film 26 being located closer to the counter substrate 12, and therefore, the gate insulating film 26 can be reliably covered with the resist pattern 55 even in a region near the edge portion of the mark 25 in which the thickness of the gate insulating film 26 is particularly likely to be thinner. As a result, the mark 25 is disposed in the sealing region 20, and it is possible to reliably prevent damage of the mark 25 while reducing the size of the non-display region 16.

The semiconductor layer 52 is provided between the gate insulating film 26 and the protective film 45, and therefore, the semiconductor layer 52 can efficiently prevent damage of the mark 25. By the mark 25 having formed without damage, the TFT substrate 11 and the counter substrate 12 can be aligned with each other with high precision and be bonded to each other.

<<Second Embodiment>>

FIGS. 45 to 48 illustrate a second embodiment of the present invention.

Figure 45:
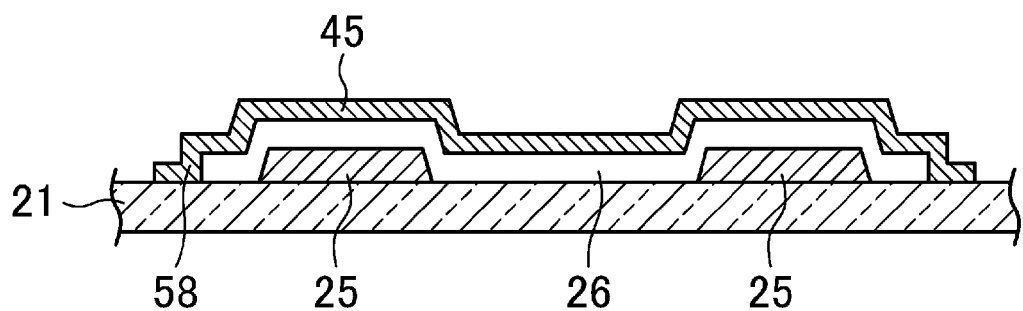
FIG. 45 is a view illustrating a cross-sectional configuration of a mark and the vicinity thereof in a TFT substrate in a second embodiment and corresponding to FIG. 7.
Figure 46:
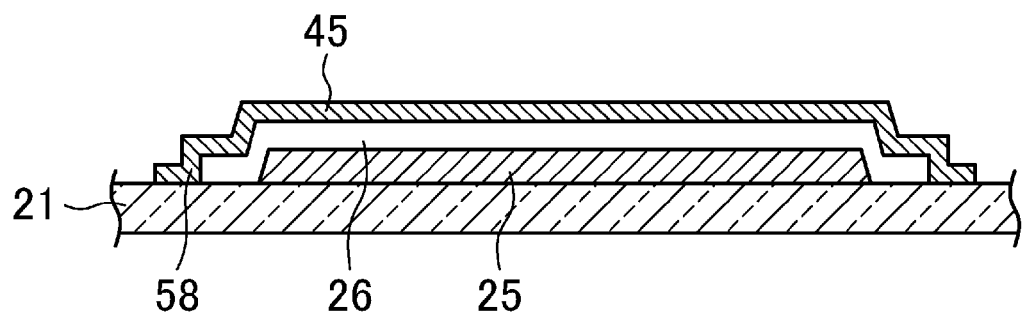
FIG. 46 is a view illustrating a cross-sectional configuration of the mark and the vicinity thereof in the TFT substrate in the second embodiment and corresponding to FIG. 6.
Figure 47:
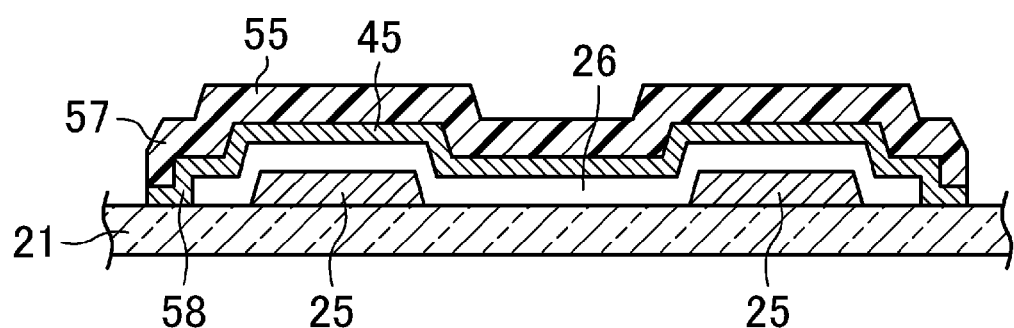
FIG. 47 is a cross-sectional view illustrating the mark and the vicinity thereof in the process of fabricating the TFT substrate.
Figure 48:
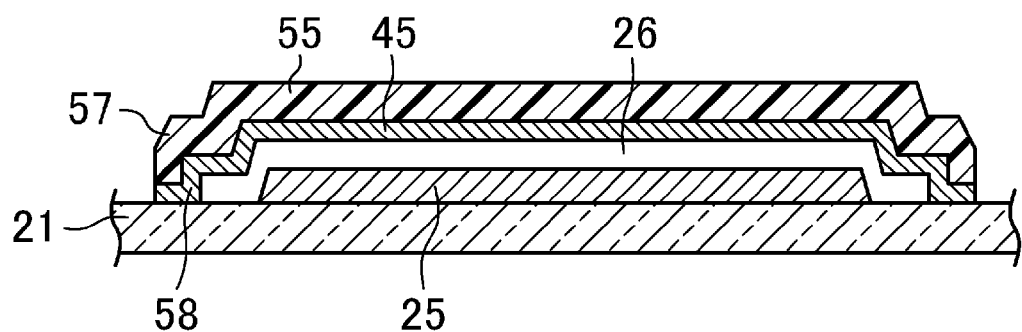
FIG. 48 is a cross-sectional view illustrating a protective film covered with a resist pattern after etching is performed.

FIG. 45 is a view illustrating a cross-sectional configuration of a mark 25 and the vicinity thereof in a TFT substrate 11 in the second embodiment and corresponding to FIG. 7. FIG. 46 is a view illustrating a cross-sectional configuration of the mark 25 and the vicinity thereof in the TFT substrate 11 in the second embodiment and corresponding to FIG. 6. FIG. 47 is a cross-sectional view illustrating the mark 25 and the vicinity thereof in the process of fabricating the TFT substrate 11. FIG. 48 is a cross-sectional view illustrating a protective film 45 covered with a resist pattern 55 after etching is performed.

In the following embodiments, the same portions as those of FIGS. 1-44 are denoted by the same reference characters, and detailed description thereof will be omitted.

In the above first embodiment, the semiconductor layer 52 remains on the surface of the gate insulating film 26 covering the mark 26, whereas in the second embodiment, a semiconductor layer 52 is once formed, and then, it is fully removed. In other words, a protective film 45 in this embodiment is directly formed on the surface of the gate insulating film 26, as illustrated FIGS. 45 and 46.

When a liquid crystal display device 1 of this embodiment is fabricated, the semiconductor layer 52 is left on each of the mark 25 and a region in which each of TFTs 30 is formed in a step corresponding to the third step (the second photolithography process) of the first embodiment.

Then, in a step corresponding to the seventh step in the first embodiment, when the semiconductor layer 52 on the mark 25 is used as an etching mask of a gate insulating film 28, the pattern of the semiconductor layer 52 is fully removed by etching. The semiconductor layer 52 in which the TFTs 30 are formed is covered with the interlayer insulating film 27 and the passivation film 28, and therefore, the semiconductor layer 52 is not etched.

In this way, if the semiconductor layer 52 is removed from the mark 25, the thickness of a part of the film (the gate insulating film 26) stacked on the edge portion of the mark 25 is thinner than that of another part of the film (for example, the region of the film in which each of the TFTs 30 is formed). However, in this embodiment, as illustrated in FIGS. 47 and 48, the gate insulating film 26 can be also reliably covered with the resist pattern 55 even in a region near the edge portion of the mark 25, and as well as the above first embodiment, the mark 25 is disposed in the sealing region 20, and it is possible to reliably prevent damage of the mark 25 while reducing the size of the non-display region 16.

<<Third Embodiment>>

FIGS. 49 to 52 illustrate a third embodiment of the present invention.

Figure 49:
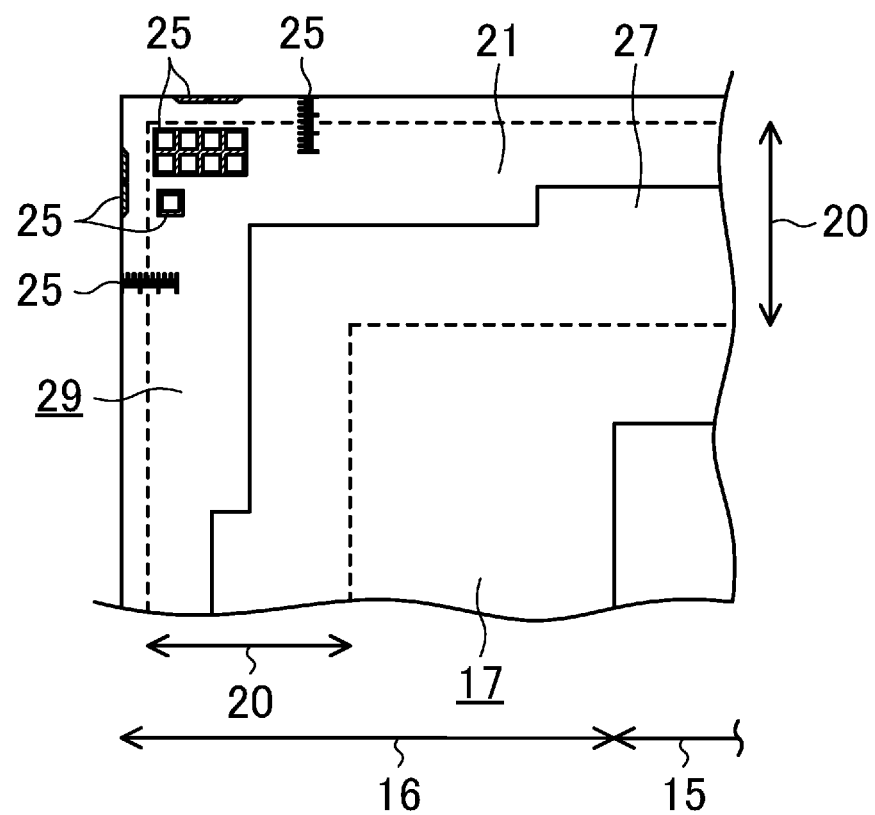
FIG. 49 is an enlarged plan view illustrating a corner portion of a TFT substrate in a third embodiment.
Figure 51:
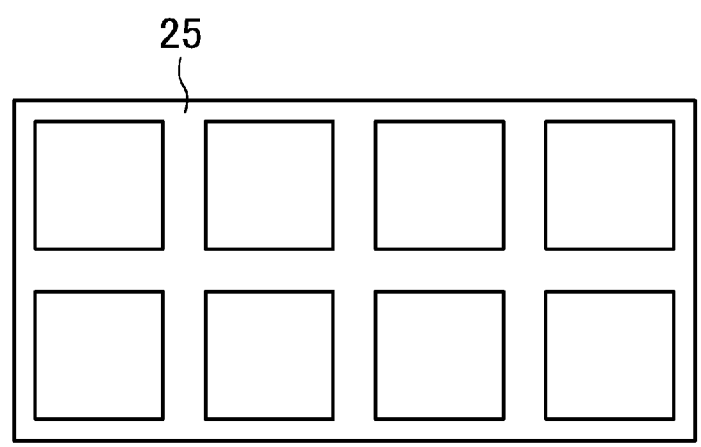
FIG. 51 is an enlarged plan view illustrating a mark in the third embodiment.
Figure 52:
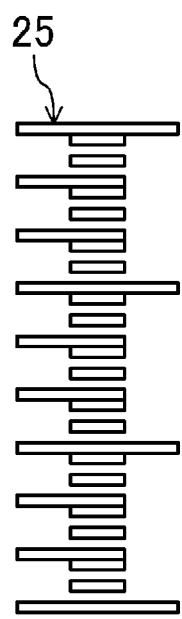
FIG. 52 is an enlarged plan view illustrating a mark in the third embodiment.
Figure 53:
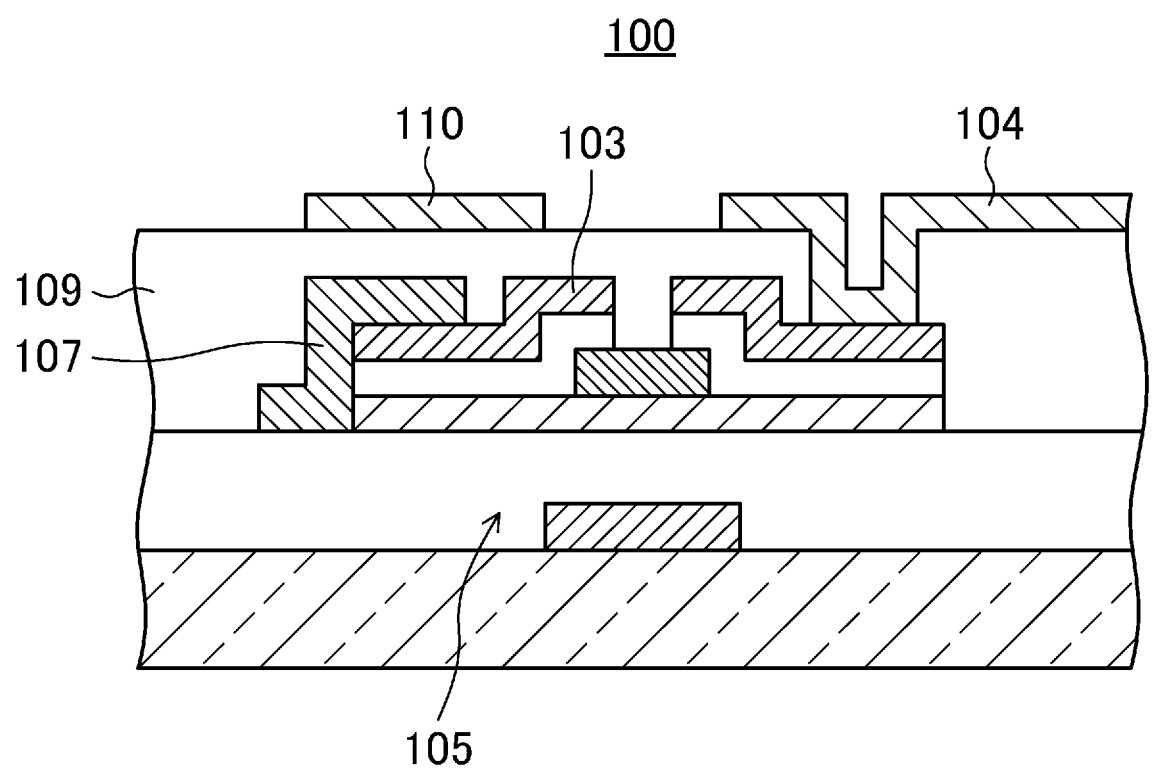
FIG. 53 is a cross-sectional view illustrating the configuration of a conventional TFT.

FIG. 49 is an enlarged plan view illustrating a corner portion of a TFT substrate 11 in the third embodiment. FIGS. 51-52 are enlarged plan views illustrating marks 25 in the third embodiment.

In the above first embodiment, the mark 25 is formed in the sealing region 20 of the TFT substrate 11 as an alignment mark for alignment with the counter substrate 12. The present invention is not limited to such a configuration, and other marks 25 may be formed as illustrated in FIGS. 49-52.

Figure 50:
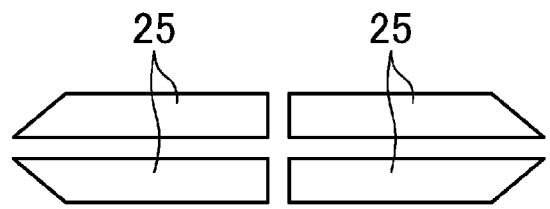
FIG. 50 is an enlarged plan view illustrating a mark in the third embodiment.

The mark 25 illustrated in FIG. 50 is a mark of a cutting line which is used when a glass substrate 21 is formed by cutting a large base glass substrate. The marks 25 illustrated in FIG. 51 are marks to visually examine an amount of displacement of the counter substrate 12 relative to the TFT substrate 11. The mark 25 illustrated in FIG. 52 is a mark to visually examine an amount of the displacement of the cutting line.

The marks 25 illustrated in FIG. 51 are composed of 8 marks of 2 rows×4 columns each of which has a configuration similar to the mark 25 of the above first embodiment. However, in a state where marks 23 of the counter substrate 12 and the marks 25 of the TFT substrate 11 are not displaced from each other, gaps of 8 pairs of the marks 23 and the marks 25, each of the gaps being formed between the outer edge portion of the mark 23 and the inner edge portion of the mark 25, are different from each other.

The gaps each formed between the marks 23 and 25 are defined, e.g., to have eight sizes ranging from 3 μm to 10 um in increments of 1 μm. With respect to the mark 23 and the mark 25 forming the gap having a length of 3 μm, if one side of the outer edge portion of the square of the mark 23 is in contact with one side of the inner edge portion of the square of the mark 25, the amount of displacement is determined to be 3 μm. When the marks 23 and the marks 25 are used, the displacement can be easily detected. When detecting the amount of displacement with high precision, the marks 23 and 25 of the first embodiment are preferably used.

<<Other Embodiments>>

In the above embodiments, the liquid crystal display device is described as an example of a display device. However, the present invention is not limited to the liquid crystal display device, and is also similarly applicable to other display devices, such as organic EL display devices, microcapsule electrophoretic display devices used for electronic books etc.

For example, in a microcapsule electrophoretic display device, an organic insulating film (interlayer insulating film) is formed under a pixel electrode provided in a TFT substrate to reduce an influence of an electric field occurring due to bus lines upon an electrode of the TFT substrate. Therefore, if the present invention is applied to the display device, it is possible to reliably prevent damage of a mark provided in a non-display region while reducing the size of the non-display region.

In the above embodiments, the transparent conductive film is described as an example of a material layer. However, the present invention is not limited to the transparent conductive film, and another layer made of a material except the transparent conductive film is applicable as a material layer.

INDUSTRIAL APPLICABILITY

As described above, the present invention is useful for active matrix substrates, methods for fabricating such active matrix substrates, and display devices.

DESCRIPTION OF REFERENCE CHARACTERS

1 Liquid crystal display device
11 TFT substrate (first substrate)
12 Counter substrate (second substrate)
14 Sealing member
15 Display region
16 Non-display region
20 Sealing region
21 Glass substrate (insulating substrate)
24 Gate electrode (electrode layer)
25 Mark
26 Gate insulating film (first insulating film)
27 Interlayer insulating film (second insulating film)
31 Pixel electrode
45 Protective film
52 Semiconductor layer
53 Transparent conductive material layer (material layer)
55 Resist pattern

The invention claimed is:

1. An active matrix substrate having a display region provided within a frame-shaped sealing region in which a sealing member is provided, and a frame-shaped non-display region formed outside the display region, and including the sealing region, and constituting a display device by being bonded to a counter substrate through the sealing member, the active matrix substrate comprising:
an insulating substrate;
an electrode layer formed on the insulating substrate within the display region;
a mark disposed on the insulating substrate within the non-display region, and made of a same material as the electrode layer;
a first insulating film directly covering each of the electrode layer and the mark; and
a second insulating film covering a part of the first insulating film, wherein
within at least a part of the sealing region, the second insulating film is not provided on the insulating substrate,
within the at least the part of the sealing region, the first insulating film is not provided in a region where the mark is not disposed,
the mark is disposed in the at least the part of the sealing region in which the second insulating film is not provided, and is provided to overlap the at least the part of the sealing region, and
a protective film is formed on the insulating substrate to cover a side surface and a surface of the first insulating film covering the mark, the surface of the first insulating film being a closest surface to the counter substrate and located opposite from the insulating substrate.

2. The active matrix substrate of claim 1, wherein
within the display region, a transparent conductive film is formed on a surface of the second insulating film, and
the protective film is made of a same material as the transparent conductive film.

3. The active matrix substrate of claim 1, wherein
the first insulating film is made of an inorganic insulating film, and
the second insulating film is made of an organic insulating film.

4. The active matrix substrate of claim 1, wherein
a semiconductor layer is disposed between the protective film and the first insulating film covering the mark.

5. The active matrix substrate of claim 1, wherein
the protective film directly covers the first insulating film covering the mark.

6. The active matrix substrate of claim 1, wherein
the mark is an alignment mark used for alignment between the active matrix substrate and the counter substrate.

7. A display device, comprising:
a first substrate;
a second substrate disposed to face the first substrate;
a frame-shaped sealing member disposed between the first substrate and the second substrate, and bonding the first substrate and the second substrate together;
a display region provided within a frame-shaped sealing region in which the sealing member is provided;
a frame-shaped non-display region formed outside the display region, and including the sealing region, wherein
the first substrate includes:
an insulating substrate;
an electrode layer formed on the insulating substrate within the display region;
a mark disposed on the insulating substrate within the non-display region, and made of a same material as the electrode layer;
a first insulating film directly covering each of the electrode layer and the mark; and
a second insulating film covering a part of the first insulating film, wherein
within at least a part of the sealing region, the second insulating film is not provided on the insulating substrate,
within the at least the part of the sealing region, the first insulating film is not provided in a region where the mark is not disposed,
the mark is disposed in the at least the part of the sealing region in which the second insulating film is not provided, and is provided to overlap the at least the part of the sealing region, and
a protective film is formed on the insulating substrate to cover a side surface and a surface of the first insulating film covering the mark, the surface of the first insulating film being a closest surface to the second substrate and located opposite from the insulating substrate.

8. The display device of claim 7, wherein
within the display region, a transparent conductive film is formed on a surface of the second insulating film, and
the protective film is made of a same material as the transparent conductive film.

9. The display device of claim 7, wherein
the first insulating film is made of an inorganic insulating film, and
the second insulating film is made of an organic insulating film.

10. The display device of claim 7, wherein
a semiconductor layer is disposed between the protective film and the first insulating film covering the mark.

11. The display device of claim 7, wherein
the protective film directly covers the first insulating film covering the mark.

12. The display device of claim 7, wherein
the mark is an alignment mark used for alignment between the first substrate and the second substrate.

13. The active matrix substrate of claim 1, wherein the protective film covers an edge portion of the mark.

14. The display device of claim 7, wherein the protective film covers an edge portion of the mark.

* * * * *